United States Patent
Christoph

(10) Patent No.: US 9,735,746 B2
(45) Date of Patent: Aug. 15, 2017

(54) AUTOMATIC LOUDNESS CONTROL

(71) Applicant: Harman Becker Automotive Systems GmbH, Karlsbad (DE)

(72) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 117 days.

(21) Appl. No.: 13/957,064

(22) Filed: Aug. 1, 2013

(65) Prior Publication Data

US 2014/0037108 A1   Feb. 6, 2014

(30) Foreign Application Priority Data

Aug. 1, 2012  (EP) .................................. 12178895
Aug. 1, 2012  (EP) .................................. 12178897
Aug. 1, 2012  (EP) .................................. 12178898

(51) Int. Cl.
  *H03G 3/00*   (2006.01)
  *H03G 3/20*   (2006.01)
  *H03G 9/00*   (2006.01)
  *H03G 9/02*   (2006.01)

(52) U.S. Cl.
  CPC .............. *H03G 3/20* (2013.01); *H03G 9/005* (2013.01); *H03G 9/025* (2013.01)

(58) Field of Classification Search
  CPC ........ H03G 9/005; H03G 3/32; H03G 3/3089; H03G 9/025; H03G 9/14; H04R 1/1083; H04R 2430/01
  USPC ................. 381/107, 104, 106, 57; 704/200.1
  See application file for complete search history.

(56) References Cited

U.S. PATENT DOCUMENTS

| | | | |
|---|---|---|---|
| 5,579,404 A * | 11/1996 | Fielder et al. | ................ 381/106 |
| 5,872,852 A * | 2/1999 | Dougherty | ..................... 381/57 |
| 7,206,420 B2 * | 4/2007 | Bizjak | ........................... 381/106 |
| 2002/0172378 A1 | 11/2002 | Bizjak | |
| 2006/0025994 A1 | 2/2006 | Christoph | |
| 2007/0291959 A1 | 12/2007 | Seefeldt et al. | |
| 2008/0137874 A1 * | 6/2008 | Christoph | ...................... 381/57 |
| 2008/0253586 A1 | 10/2008 | Wei | |

(Continued)

FOREIGN PATENT DOCUMENTS

| CN | 1533134 A | 9/2004 |
|---|---|---|
| CN | 101048935 A | 10/2007 |

(Continued)

OTHER PUBLICATIONS

Chinese Office Action and English translation for corresponding Application No. 201310331512.1, mailed Aug. 30, 2016, 19 pages.

(Continued)

*Primary Examiner* — Paul S Kim
*Assistant Examiner* — Norman Yu
(74) *Attorney, Agent, or Firm* — Brooks Kushman P.C.

(57) ABSTRACT

An improved automatic loudness control system and method comprise controlling gain/attenuation applied to an input audio signal and providing an output audio signal that is the amplified/attenuated input audio signal; evaluating an actual loudness of the input audio signal from the input audio signal and a desired loudness of the input audio signal from a volume control input; and evaluating the gain/attenuation applied to the input audio signal from the actual loudness and the desired loudness of the input audio signal.

34 Claims, 7 Drawing Sheets

(56) References Cited

U.S. PATENT DOCUMENTS

2009/0034747 A1    2/2009  Christoph
2009/0097676 A1*   4/2009  Seefeldt ........................ 381/107

FOREIGN PATENT DOCUMENTS

| CN | 101997498 A   | 3/2011  |
| EP | 1619793 A1    | 1/2006  |
| EP | 2131357 A1    | 12/2009 |
| WO | 2008156427 A1 | 12/2008 |

OTHER PUBLICATIONS

Extended European Search Report for corresponding Application No. 12178895.4, mailed Nov. 6, 2012, 7 pages.
Extended European Search Report for corresponding Application No. 12178897.0, mailed Nov. 6, 2012, 7 pages.
Extended European Search Report for corresponding Application No. 12178898.8, mailed Nov. 5, 2012, 8 pages.
European Office Action for Application No. 12 178 895.4, mailed May 2, 2016, 8 pages.
European Office Action for Application No. 12 178 897.0, mailed May 2, 2016, 9 pages.
European Office Action for Application No. 12 178 898.8, mailed May 2, 2016, 6 pages.
Chinese Office Action and English translation for Application No. 201310331910.3, mailed Aug. 23, 2016, 18 pages.

* cited by examiner

AUTOMATIC LOUDNESS CONTROL

CLAIM OF PRIORITY

This patent application claims priority from EP Application No. 12 178 895.4-2215 filed Aug. 1, 2012, EP Application No. 12 178 897.0-2215 filed Aug. 1, 2012 and EP Application No. 12 178 898.8 filed Aug. 1, 2012, each of which is hereby incorporated by reference.

FIELD OF TECHNOLOGY

The system and methods disclosed herein relate to an automatic loudness control system and method, in particular for audio reproduction systems.

RELATED ART

Any type of audio content can be stored as audio signals on a variety of mass storage media such as CDs, DVDs, semiconductor memories, hard discs or the like. Highly effective audio signal compression methods such as MP3 allow for storing even more audio content. The different content can be combined into playlists. Broadcasts may also be a source of varying audio content, including music and speech, radio programs and advertisement etc. The various content, alone or in combination with each other, may provide audio signals with strongly varying signal levels and signal dynamics which are perceived by a listener as having different loudness levels. However, excessive loudness levels, high dynamics, etc. are generally considered unpleasant or even annoying. Common automatic loudness control systems and methods are intended to level out such loudness fluctuations, but either are not sufficiently effective or deteriorate the audio content.

There is a need for an improved automatic loudness control (ALC) system.

SUMMARY OF THE INVENTION

An improved automatic loudness control system comprises a controllable gain/attenuation unit that has a gain/attenuation control input, an audio signal input, an audio signal output, and whose gain/attenuation between audio signal output and audio signal input is controlled by the gain/attenuation control input signal. A gain/attenuation evaluation unit is connected to the gain/attenuation control input of the controllable gain/attenuation unit and has an actual-loudness input and a desired-loudness input. An actual-loudness evaluation unit is connected between the audio signal input of the controllable gain/attenuation unit and provides the actual-loudness input to the gain/attenuation evaluation unit. A desired-loudness evaluation unit that is connected to the desired-loudness input of the gain/attenuation evaluation unit and that has a volume control input. The gain/attenuation evaluation unit is configured to control the controllable gain/attenuation unit dependent on signals supplied to the volume control input of the desired-loudness evaluation unit and the audio signal input of the controllable gain/attenuation unit.

An improved automatic loudness control method comprises controlling gain/attenuation applied to an input audio signal and providing an output audio signal that is the amplified/attenuated input audio signal; evaluating an actual loudness of the input audio signal from the input audio signal and a desired loudness of the input audio signal from a volume control input; and evaluating the gain/attenuation applied to the input audio signal from the actual loudness and the desired loudness of the input audio signal.

These and other objects, features and advantages of the present invention will become apparent in light of the detailed description of the embodiments thereof, as illustrated in the accompanying drawings. In the figures, like reference numerals designate corresponding parts.

DESCRIPTION OF THE DRAWINGS

Various specific embodiments are described in more detail below based on the exemplary embodiments shown in the figures of the drawings. Unless stated otherwise, similar or identical components are labeled in all of the figures with the same reference numbers.

DETAILED DESCRIPTION OF THE INVENTION

According to the American National Standards Institute, "American national psychoacoustical terminology", S3.20, 1973, American Standards Association, "loudness" is defined as an "attribute of auditory sensation in terms of which sounds can be ordered on a scale extending from quiet to loud." With other words, loudness is the quality of a sound that is primarily a psychological correlate of physical strength (magnitude). The perception of loudness is related to both the sound pressure level and duration of a sound. The human auditory system integrates (averages) the effects of sound pressure level (SPL) over a 600-1,000 ms window. For example, a sound of constant SPL will be perceived to increase in loudness as 20, 50, 100, 200 ms samples are played, up to a maximum of approximately 1 second at which point the perception of loudness will stabilize. For long duration sounds greater than 1 second the momentary perception of loudness will be based on the integration of the preceding 600-1,000 ms.

In teens of the relationship between SPL and loudness for sounds longer than 1 second, this can be approximated by a power function plotted against sound pressure or sound intensity (Stevens' power law). More precise measurements have been subsequently made that show that loudness grows more rapidly (with a higher exponent) at low and high levels and less rapidly (with a lower exponent) at moderate levels.

Figure 1:
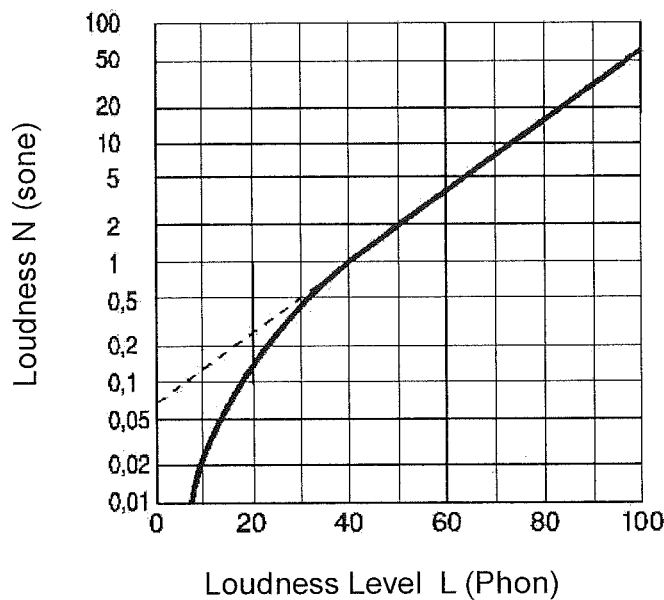
FIG. 1 is a graph illustrating the relationship between loudness and loudness level.

Units used to measure loudness are Sone (loudness N) and Phon (loudness level L). The relationship between Sone and Phon for exiting uniform noise signal is depicted in FIG. 1. Uniform exiting noise is intended to represent an average audio signal. Narrow band signals, in particular periodic signals, exhibit a different relationship.

Figure 2:
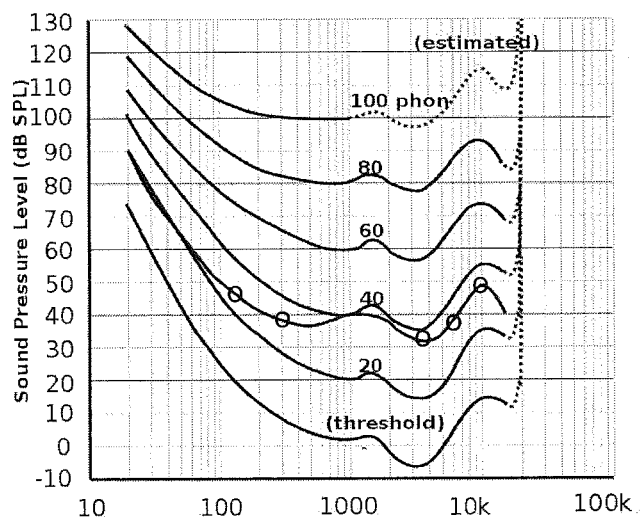
FIG. 2 is a graph illustrating the equal-loudness-level contours of the human ear.

The sensitivity of the human ear changes as a function of frequency, as shown in the graph of FIG. 2. Each line on this graph shows the SPL required for frequencies to be perceived as equally loud, whereby the solid lines depict the equal-loudness contours from ISO 226:2003 revision and the line marked with "o" depicts the original ISO standard for 40 phons. The graph illustrates that humans are most sensitive to sounds around 2-4 kHz, with sensitivity declining to either side of this region. A complete model of the perception of loudness will include the integration of SPL by frequency and the duration of each sound.

When two sounds are heard simultaneously, it is possible for one sound to "mask" the other, meaning that the listener only hears the louder of the two sounds. This is called simultaneous masking or auditory masking. Simultaneous masking only occurs if one sound almost completely covers the time-frequency distribution of the other. The louder signal can be called the "masker," while the quieter signal can be called the "masked signal". Simultaneous masking occurs if the difference between the loudness of the masker plus the signal and the loudness of the masker alone, in every frequency, is below the just-noticeable-difference (JND) of loudness, which is about 1 dB.

Temporal masking, also known as "non-simultaneous masking," occurs when a sudden stimulus sound makes inaudible other sounds which are present immediately preceding or following the stimulus. Masking which obscures a sound immediately preceding the masker is called backward masking or pre-masking and masking which obscures a sound immediately following the masker is called forward masking or post-masking. Temporal masking's effectiveness attenuates exponentially from the onset and offset of the masker, with the onset attenuation lasting approximately 20 ms and the offset attenuation lasting approximately 100 ms. Similar to simultaneous masking, temporal masking reveals the frequency analysis performed by the auditory system. When two tones with similar frequencies are played together, their combined loudness is the cube root of the sum of their intensities. When the frequencies are farther apart than one critical band, their loudness levels are instead add together.

Figure 3:
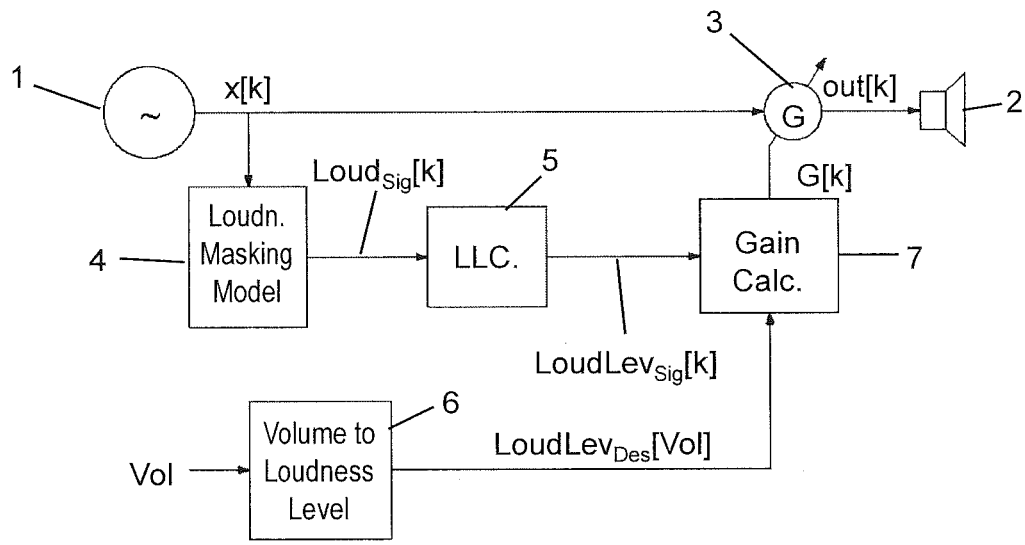
FIG. 3 is a block diagram illustrating an exemplary automatic loudness control system with frequency independent gain/attenuation control.

Referring now to FIG. 3, an exemplary automatic loudness control system is shown which is connected between an audio signal source 1 and a loudspeaker 2. The system includes a controllable gain/attenuation unit 3, e.g., an amplifier with controllable gain or attenuator, or a multiplier that allows for controlling both gain and attenuation as the case may be. The audio source 1 generates an input audio signal x[k] which is supplied to a psychoacoustic modeling (PAM) unit such as a loudness modeling unit 4 and to an audio signal input of the controllable gain/attenuation unit 3. The loudness modeling unit 4 reproduces with electrical, e.g., digital signals and based on a (digital) psychoacoustic masking model the acoustic masking behavior of the human ear or selected masking effects thereof.

The loudness modeling unit 4 supplies a loudness signal $Loud_{Sig}[k]$ representing the calculated (broadband) loudness (level) curve of the input audio signal x[k] to a loudness level calculation unit 5 which calculates a loudness-level signal $LoudLev_{Sig}[k]$ of the input audio signal x[k], i.e., its actual loudness level. A desired loudness level is provided by a volume-to-loudness-level conversion unit 6 as a desired-loudness-level signal $LoudLev_{Des}[Vol]$. The volume-to-loudness-level conversion unit 6 may, for instance, employ a look-up table or a calculation scheme for conversion. The desired loudness level can be selected by way of a volume control element (not shown) such as a control wheel, potentiometer, keyboard, touch screen etc., which provides a volume (Vol) setting (or signal) to the volume-to-loudness-level conversion unit 6.

The actual and the desired loudness levels, i.e., the loudness signals $LoudLev_{Sig}[k]$ and $LoudLev_{Des}[Vol]$, are fed into a gain/attenuation calculation unit 7 that generates a gain/attenuation control signal G[k] with which the gain/attenuation unit 3 is controlled, so that the input audio signal x[k] is amplified/attenuated by the gain/attenuation unit 3 to provide an output audio signal out[k] to the loudspeaker 2. Accordingly, the gain/attenuation applied to the input audio signal is controlled and the amplified/attenuated input audio signal is provided as an output audio signal out(k). The actual loudness of the input audio signal is ascertained (e.g., calculated) from the input audio signal and the desired loudness of the input audio signal is ascertained (e.g., calculated) from the volume control input. From the actual loudness and the desired loudness of the input audio signal the gain/attenuation to be applied to the input audio signal is ascertained.

Figure 4:
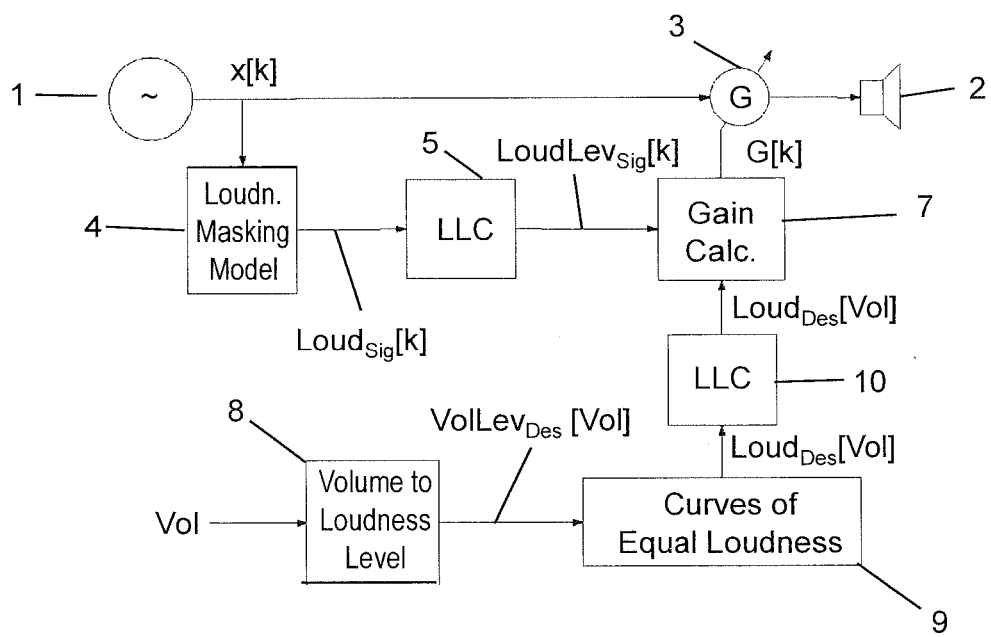
FIG. 4 is a block diagram illustrating another exemplary automatic loudness control system with frequency independent gain/attenuation control.

In FIG. 4, an alternative way of generating the desired-loudness-level signal $LoudLev_{Des}[Vol]$ from the volume (Vol) setting is shown. The Vol setting is supplied to a volume-to-loudness-level conversion unit 8 to provide a volume level signal VolLev[Vol] therefrom. The volume-to-loudness-level conversion unit 8 may employ a table or a mathematical equation that represents the relationship between loudness N and loudness level L as shown in FIG. 1, in which the volume (Vol) corresponds to loudness N and volume level VolLev[Vol] corresponds to loudness N. The volume level VolLev[Vol] is supplied to an equal-loudness unit 9 which provides a desired loudness signal $Loud_{Des}$[Vol] representing the desired broadband loudness. The equal loudness unit 9 may employ, by way of tables, mathematical algorithm, software models etc., the curves of perceptually equal loudness levels, also called equal-loudness curves or equal-loudness-level contours, as shown in the graph of FIG. 2. The desired loudness, i.e., the desired loudness signal $Loud_{Des}$[Vol], is then translated by a loudness level calculation unit 10 into the desired loudness level signal $LoudLev_{Des}$[Vol] which is supplied to the gain/attenuation calculation unit 7.

The systems of FIGS. 3 and 4 are quite sufficient for all applications in which spectral aspects of loudness are less important or are not dominant as, e.g., with monotone or uniform audio signals. However, in all cases in which the spectral distribution of the audio signal matters, more sophisticated systems in terms of spectral behavior are advantageous.

Figure 5:
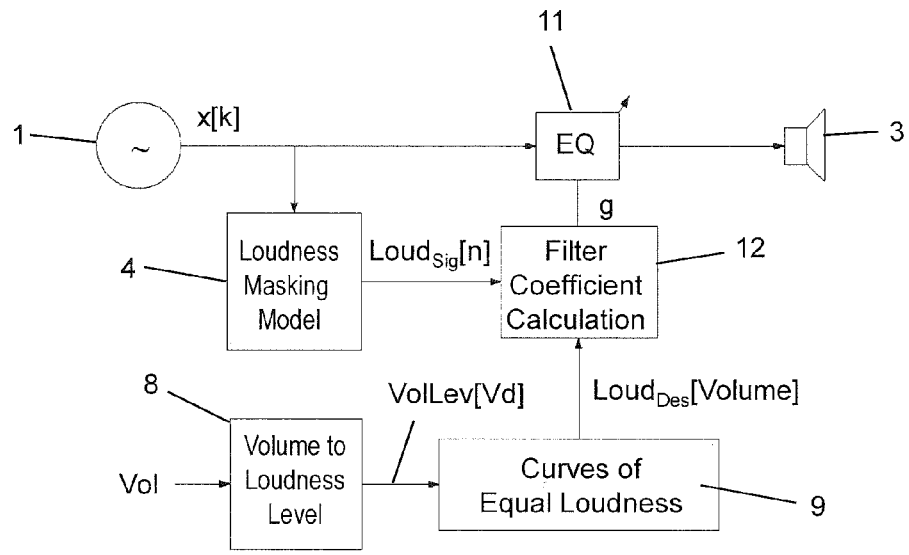
FIG. 5 is a block diagram illustrating an exemplary automatic loudness control system with frequency dependent gain/attenuation control.

Reference is made to FIG. 5, which is based on the system of FIG. 4. The system of FIG. 5 has a frequency dependent controllable gain/attenuation unit, e.g., controllable equalizing (EQ) unit 11 that substitutes the frequency independent gain/attenuation unit 3 and a filter coefficient calculation unit 12 that substitutes the gain/attenuation calculation unit 7. Loudness level calculation unit 5 and loudness level calculation unit 10 can be eliminated so that loudness modeling unit 4 and the equal loudness unit 9 are directly coupled to the controllable equalizing unit 11 to supply the actual-loudness signal $Loud_{Sig}$[k] and the desired-loudness signal $Loud_{Des}$[Vol] to the controllable equalizing unit 11. The controllable equalizing unit 11 provides frequency dependent gains/attenuations for the input audio signal x[k].

There exist several ways to implement the equalizing functionality in the controllable equalizing unit 11. For instance, fast convolution in the frequency domain may be employed in connection with a Fast Fourier Transform (FFT) of the input audio signal x[k] which is in the time domain, and an Inverse Fast Fourier Transform of the processed signal audio signal x[k], which is in the frequency domain, so that the output audio signal out[k] is in the time domain. Another option is to process the input audio signal x[k] in the time domain with (constrained) Finite Impulse Response Filters (FIR). The first option requires more memory but less calculation time and the second option requires less memory but more calculation time. Further applicable ways of equalizing may include predictor or prediction error filters whose coefficients may be determined by Linear Prediction Coding (LPC) analysis using, e.g., the Gradient Adaptive Lattice (GAL) or the Levinson-Durbin recursion algorithm.

A drawback of automatic loudness control systems and methods, in particular in automotive applications, is background noise. The acoustic audio signal radiated by the loudspeaker 2, e.g., in a vehicle, should be perceivable to the listener, meaning that it has to exceed the noise present, but the overall audio signal level should not exceed a certain level in order to be still perceived as pleasant.

Figure 6:
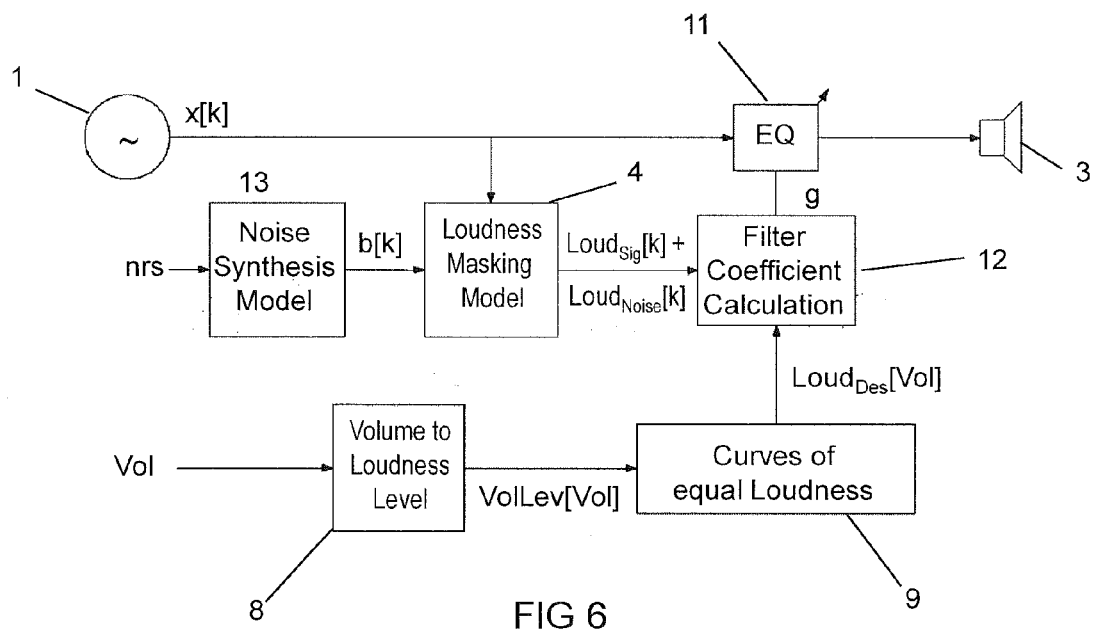
FIG. 6 is a block diagram illustrating another exemplary automatic loudness control system with frequency dependent gain/attenuation control involving synthesized background noise.

Referring to FIG. 6, in order to address the background noise problem, a noise synthesizer unit 13 that employs a noise synthesis model and that evaluates at least one (non-acoustic) noise related signal(s) nrs[k] corresponding to the background noise such as a signal that represents the speed of the vehicle or the revolutions per minute (rpm) of the vehicle engine is added to the system of FIG. 5. For instance, the noise that is generated by the motor and that is mainly dependent on the motor's rpm and/or the noise that is generated by the wheels or the wind and that is mainly dependent on the vehicle's speed may contribute most to the background noise in the interior of the vehicle. The noise synthesizer unit 13 generates on the basis of the evaluated noise related signal(s) nrs[k] sound that is similar or even identical to the background noise in the vehicle interior and supplies this synthesized, e.g., "estimated" noise as background noise signal b[k] as second input to the loudness modeling unit 4 which then generates actual loudness signals $Loud_{Sig}$[k] and $Loud_{Noise}$[k], of both the input audio signal x [k] and the background noise signal b[k] and supplies them to the filter coefficient calculation unit 12. The filter coefficient calculation unit 12 controls the filter coefficients of the controllable equalizing unit 11 which provides, based on both actual loudness signals, $Loud_{Sig}$[k] and $Loud_{Noise}$[k], frequency dependent gains/attenuations for the input audio signal x[k]. Calculation may include that the maxima of the signals $Loud_{Des}$[Vol] and $Loud_{Noise}$[k] are compared to each other, thereby forming a new reference (instead of $Loud_{Des}$[Vol] solely) with which the actual-loudness signal $Loud_{Sig}$[k] is compared. The difference between the new reference and the actual-loudness signal $Loud_{Sig}$[k] indicates how much the coefficients have to be changed to achieve the desired loudness.

Figure 7:
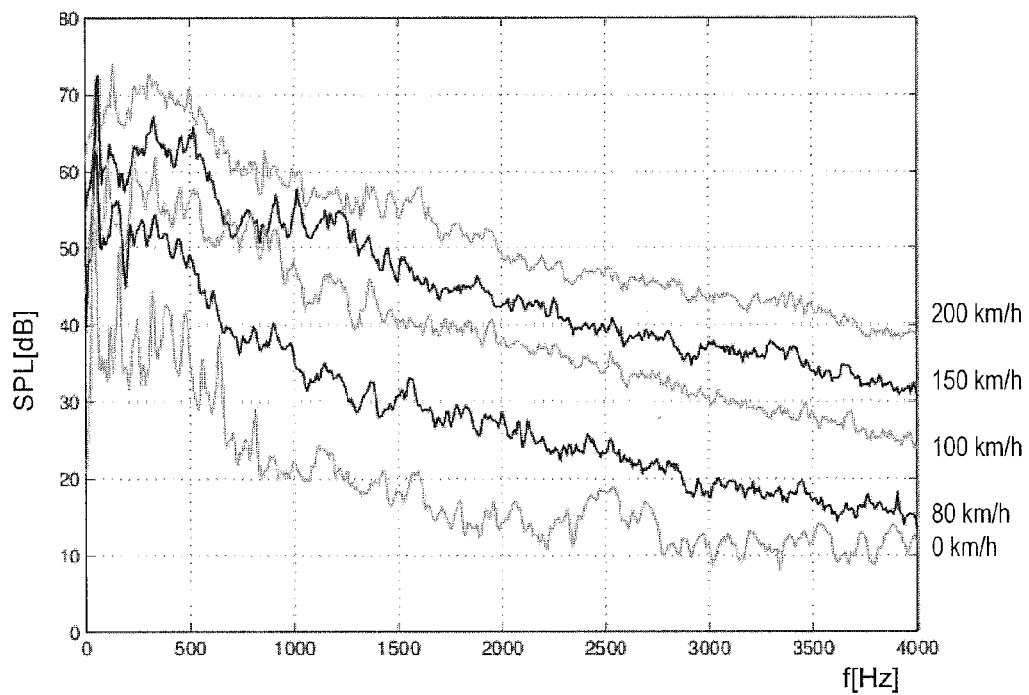
FIG. 7 is a graph illustrating typical characteristics of background noise in a vehicle interior for various vehicle speeds.

Instead of estimations based on noise representing signals a background noise profile, i.e., the actual background noise characteristics for various vehicle speeds rpm, others) may be used for evaluating the background noise present in the vehicle interior. FIG. 7 depicts such (e.g., once-measured and stored) characteristics of background noise in a vehicle interior for various vehicle speeds as noise SPL in dB over frequency f in Hz. As can be seen, the distribution of amplitudes over frequency per speed exhibit similar shapes, however, the levels per frequency are shifted dependent on the vehicle speed—the higher the speed, the higher the level. By way of such a background noise profile and a sensor that determines the vehicle speed, the background noise can easily be synthesized.

Figure 8:
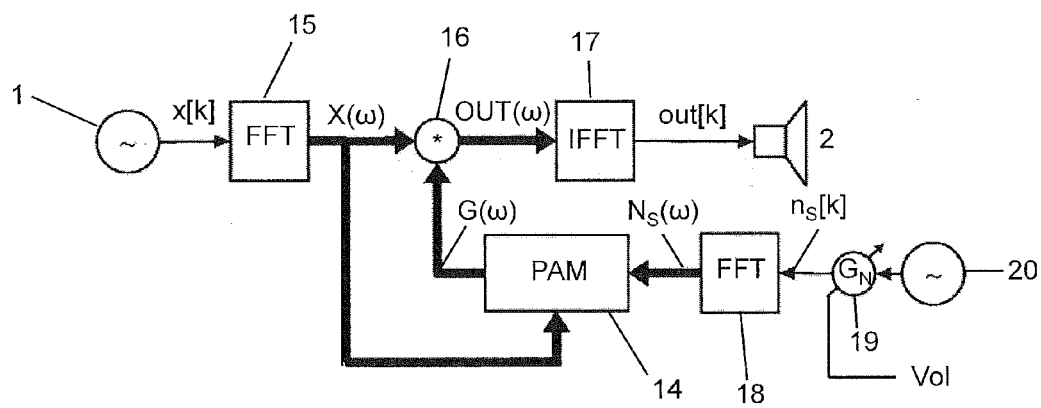
FIG. 8 is a block diagram illustrating an exemplary automatic loudness control system with frequency dependent dynamic gain/attenuation control utilizing a psychoacoustic model (PAM) for the calculation of the spectral loudness of the input signal.

FIG. 8 illustrates an improved ALC system in which signals are mainly processed in the frequency domain. In the system of FIG. 8, the audio signal source 1 supplies the input audio signal x[k], which is in the time domain, to a Fast-Fourier transform (FFT) unit 15 which transforms it into an input audio signal X($\omega$) in the frequency domain. The input audio signal X($\omega$) is supplied to a psychoacoustic model (PAM) unit such as a psychoacoustic gain shaping unit 14 and to a multiplier 16 which also receives a signal G($\omega$) representing spectral gain factors from the psychoacoustic gain shaping unit 14 and generates a spectral output audio signal OUT($\omega$), which is fed into an inverse Fast-Fourier transform (IFFT) unit 17 where it is transformed into the output audio signal out[k] in the time domain. An estimated noise spectrum $N_S(\omega)$ is supplied to the psychoacoustic gain shaping unit 14 by another Fast-Fourier transform (FFT) unit 18 which transforms a noise signal $n_s$[k] from the time domain into the estimated noise spectrum $N_S(\omega)$ in the frequency domain. The estimated noise signal $n_s$[k] is an amplified/attenuated output signal of a background noise generator/synthesizer 20. Gain/attenuation is applied to the input audio signal x[k] by a controllable gain/attenuation unit 19 dependent on the volume (Vol) settings, which may be transformed into a desired, broadband loudness function by way of the psychoacoustic model (PAM).

Linear predictive coding (LPC) may be employed as a simple and efficient method for converting with a reduced length and in the time domain the gain/attenuation factors g which may be applied in a prediction filter. The transition from the time to the spectral domain can take place either using a Fast Fourier Transform (FFT) (or a warped Fast Fourier Transform (WFFT)), where certain spectral bins can be grouped in psychoacoustically motivated frequency bands of different widths (e.g., based on a Bark scale).

Linear predictive coding (LPC) is a method for spectral estimation and synthesis. In speech encoding, LPC attempts to estimate the power spectrum density (PSD) of a sound in terms of the filter coefficients which would be needed to synthesise that sound when applied to an excitation source, which may be either noise or a band-limited pulse wave in which all the harmonics are of equal amplitude. In a synthesis application as in the present case, both the excitation waveform and the filter coefficients can be modified (in both the frequency and time domains) to create related variants of the original sound.

When calculating the frequency dependent gain factors $G(\omega)$), the spectrum of the input audio signal $X(\omega)$ can be used along with the estimated noise spectrum $N_S(\omega)$. In doing so, masking effects can be considered in addition to a detailed reproduction of the ear's characteristics. The differentiating frequency resolution property of the human ear can be considered as early as during the transition from the time range to the spectral range, e.g., using a psychoacoustically motivated filter bank or a WFFT, but this is not mandatory. A conventional FFT may also be used and the spectral lines then processed in psychoacoustically motivated groups as well as a variable tap profile for sub-band adaptive filter.

Equalization of the input audio signal x[k] may be carried out in the frequency domain using the fast convolution. Depending on the length of the FIR filter or the FFT (Fast Fourier Transform), this approach can considerably shorten the computing time. A general rule of thumb is that FIR filters with a length of about 30 taps can be implemented with greater computing efficiency using the fast convolution than in the time domain. However, the fast convolution can significantly increase memory requirements under certain circumstances. This is not just a problem associated with the fast convolution; it also occurs with every form of signal processing in the frequency domain. Either an FFT or warped FFT (WFFT) or a psychoacoustically motivated filter bank with frequency bands of different widths can be used for the transition from the time to the frequency domain. The frequency resolution characteristics of the human ear could already be considered here. However, as already mentioned, a conventional FFT can also be used. In this case, the spectral lines may be subsequently processed as groups in the frequency domain in order to take account of the frequency resolution characteristics of the human ear. Applicable psychoacoustic models are, for instance, the Johnston model or the MPEG model.

Figure 9:
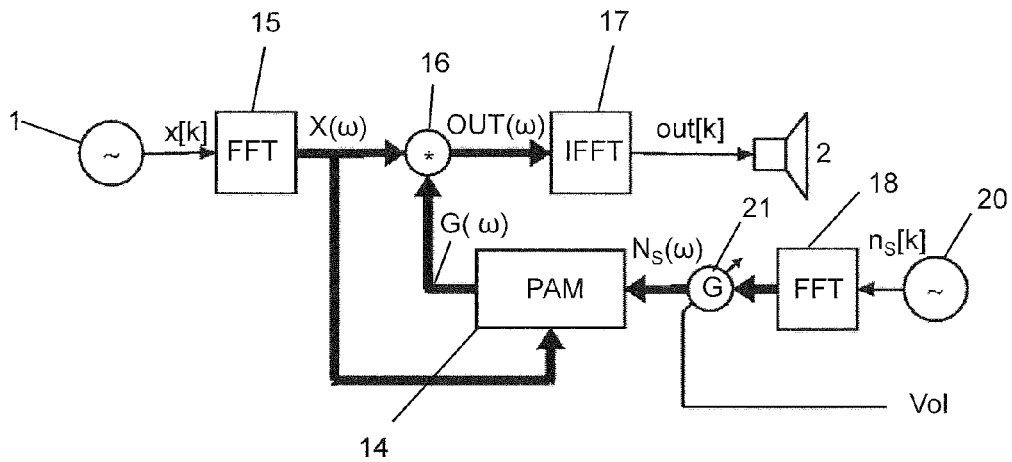
FIG. 9 is a block diagram illustrating another exemplary automatic loudness control system with frequency dependent dynamic gain/attenuation control involving synthesized background noise in order to define a desired, spectral trajectory of the loudness, controlled by volume settings.

A modified system of FIG. 8 is shown in FIG. 9. In the system of FIG. 9, amplification/attenuation of the noise signal $N_S(\omega)$ is shifted from the time domain into the frequency domain. Thus, the controllable gain/attenuation unit 19 operating in the time domain has been omitted and a controllable gain/attenuation unit 21 operating in the frequency domain has been added between Fast-Fourier transform (FFT) unit 18 and the psychoacoustic gain shaping unit 14.

Figure 10:
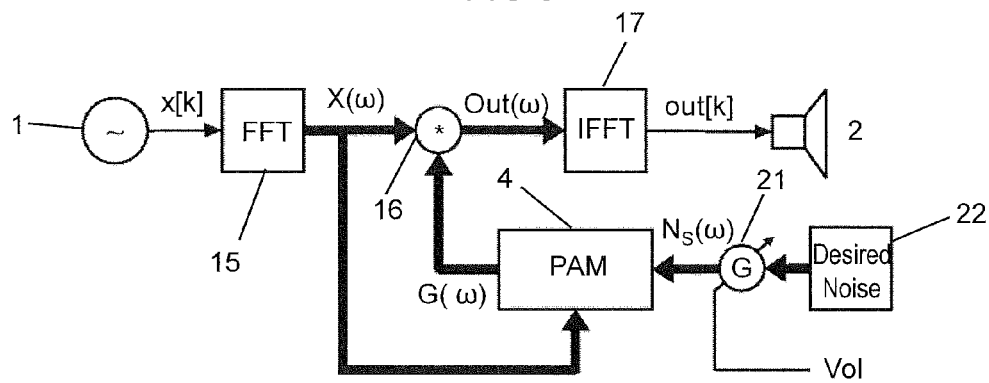
FIG. 10 is a block diagram illustrating still another exemplary automatic loudness control system with frequency dependent dynamic gain/attenuation control involving spectral loudness curves of desired synthesized background noise, controlled by volume settings.

A modified system of FIG. 9 is shown in FIG. 10. In the system of FIG. 10, the background noise generator/synthesizer 20 operating in the time domain and the Fast-Fourier transform (FFT) unit 18 have been omitted, and a desired background noise synthesizer 22 operating in the frequency domain has been added upstream of the controllable gain/attenuation unit 21. The system of FIG. 10 is highly efficient in terms of performance and allows an in anyway colored noise signal or its power spectrum density (PSD) to be directly processed according to a psychoacoustic spectrum, e.g., the Bark scale, and directly controlled by the volume (Vol) settings prior to the application of the psychoacoustic model. As can be seen from FIG. 10, no additional noise generator/synthesizer operating in the time domain and no FFT with, e.g., a Bark scale is needed. Equalizing is performed in the system of FIG. 10 as in the systems of FIGS. 8 and 9 by way of frequency dependent gain/attenuation $(G(\omega))$ control according to the difference between the loudness/masking thresholds of the reference signal (specified as desired noise) and the input audio signal e.g., music signal).

Figure 12:
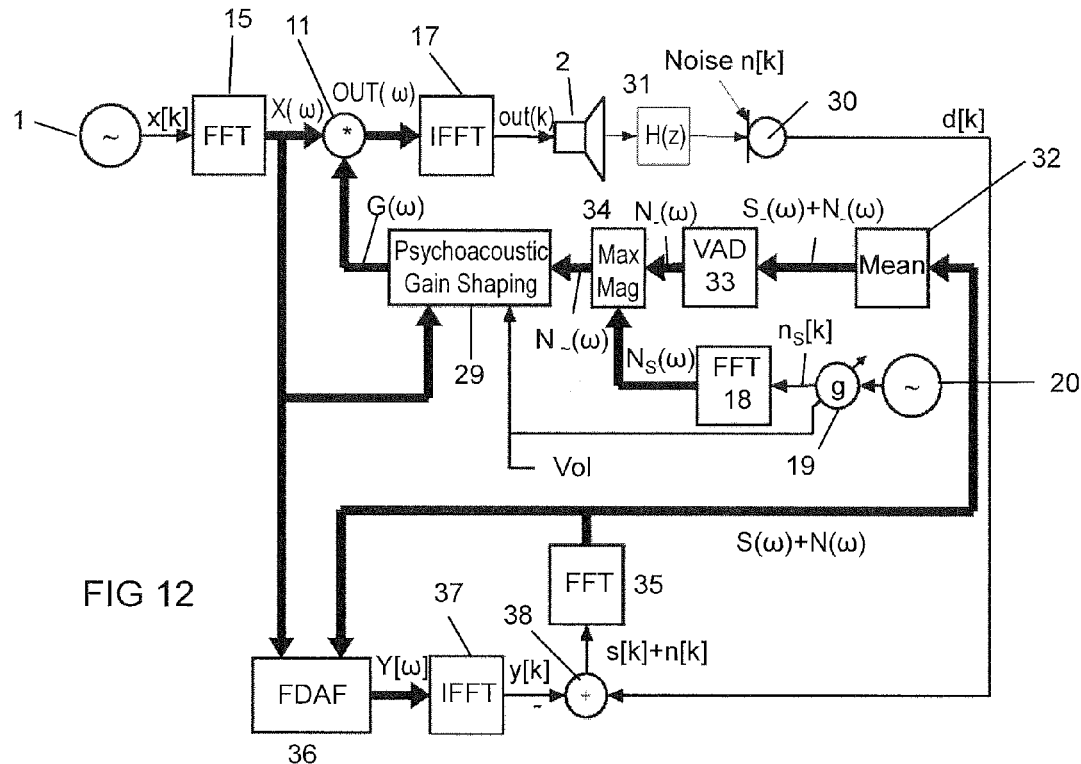
FIG. 12 is a block diagram illustrating an exemplary automatic loudness control system with frequency dependent dynamic gain/attenuation control involving acoustically picked-up background noise.
Figure 13:
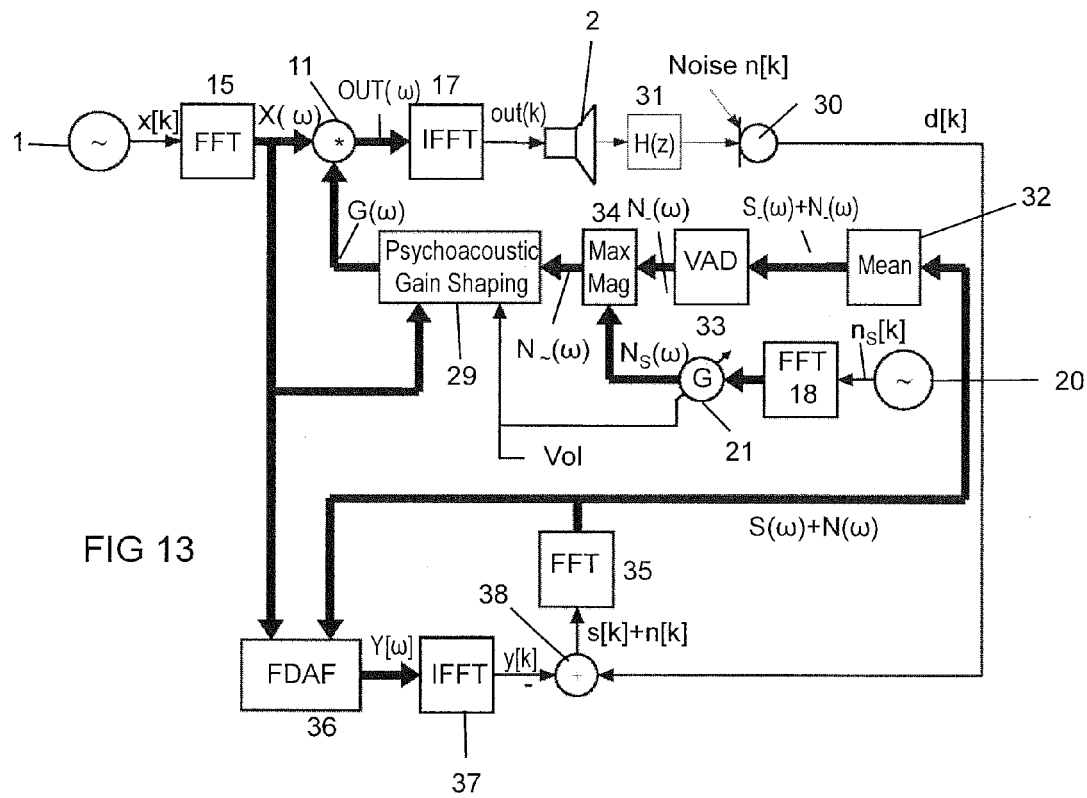
FIG. 13 is a block diagram illustrating another exemplary automatic loudness control system with frequency dependent dynamic gain/attenuation control involving acoustically picked-up background noise.
Figure 14:
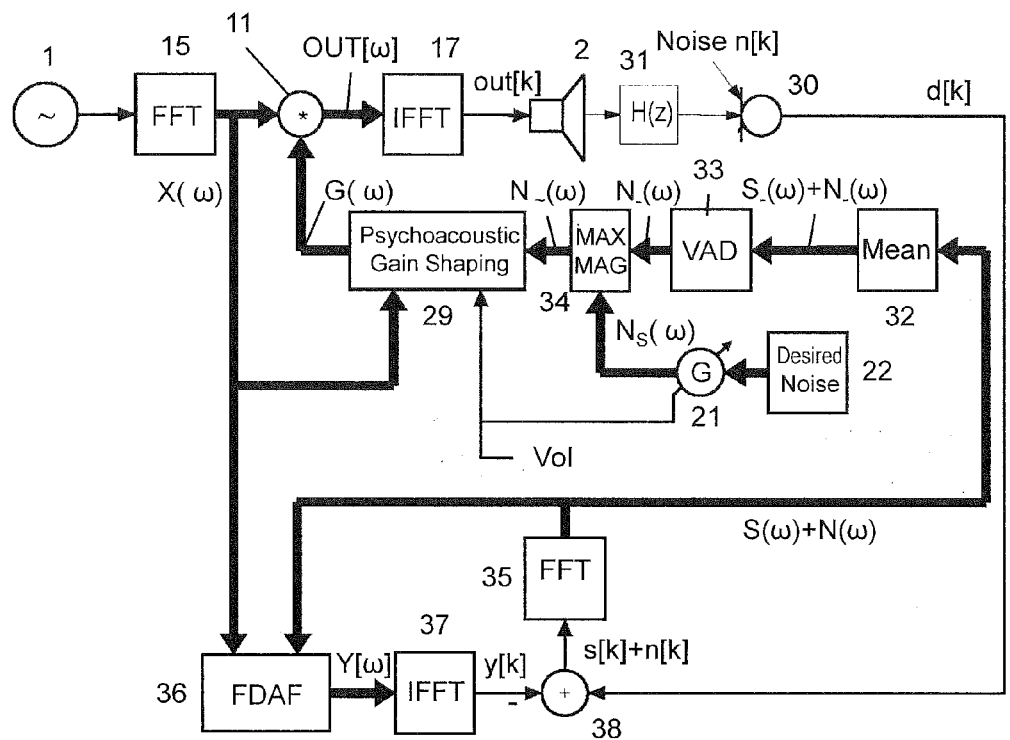
FIG. 14 is a block diagram illustrating still another exemplary automatic loudness control system with frequency dependent dynamic gain/attenuation control involving acoustically picked-up background noise.

Instead of approximating or estimating the noise signal based on non-acoustic sensor signals, instant noise signals may be picked up by an acoustic sensor such as a microphone. Such microphone may be arranged in the vehicle interior close to a listener's head. In FIGS. 12, 13 and 14, ALC systems are described that employ acoustic noise sensors and even more advanced psychoacoustic modeling.

Figure 11:
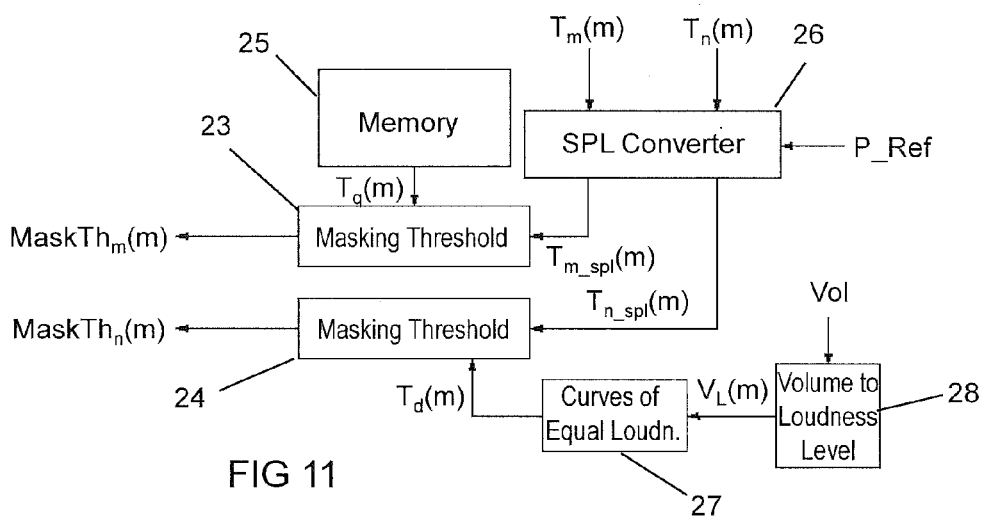
FIG. 11 is a block diagram illustrating an exemplary psychoacoustic modeling unit for implementing a desired loudness curve in improved ALC systems.

Referring to FIG. 11, an exemplary psychoacoustic modeling unit (in the frequency domain), for use in improved ALC systems may include two masking threshold calculation units 23 and 24 which provide output masking thresholds $MaskTh_m(m)$ and $MaskTh_n(m)$. One of the masking threshold calculation units (e.g., 23) addresses the masking of the audio signal and the other (e.g., 24) addresses masking with regard to the volume (Vol) setting (and, as the case may be, noise). The masking threshold calculation unit 23 receives sound pressure level masking thresholds $Th_{m\_spl}(m)$ and thresholds $T_q(m)$ representing the absolute thresholds of hearing in an average human ear. The masking threshold calculation unit 24 receives sound pressure level masking thresholds $Th_{n\_spl}(m)$ and thresholds $T_d(m)$ representing the curves of equal loudness levels. The thresholds $T_q(m)$ are provided by, e.g., a memory 25; thresholds $Th_{m\_spl}(m)$ and $Th_{n\_spl}(m)$ are provided by a SPL conversion unit 26 that receives thresholds $T_m(m)$, $T_n(m)$ and, if required, a reference level P_Ref; and the thresholds $T_d(m)$ are provided by an equal loudness unit 27. The volume setting Vol is supplied to a volume-to-loudness-level conversion unit 28 to provide a volume level signal $V_L(m)$ therefrom. The volume-to-loudness-level conversion unit 28 may employ a table or a mathematical equation that represents the relationship between loudness N and loudness level L as shown in FIG. 1 in which volume Vol corresponds to loudness N and volume level $V_L$ corresponds to loudness N. The volume level $V_L(m)$ is supplied to the equal-loudness unit 27. Herein, k is a (discrete) time index, $\omega$ is a (discrete) frequency index (bin) and m is the number of a certain frequency group bin (e.g., in Bark).

As in the system described above with reference to FIG. 5, in the part of the psychoacoustic modeling unit of FIG. 11 the volume (Vol) setting is converted into the loudness level $V_L(m)$. By way of the loudness level $V_L(m)$, one curve of the curves of equal loudness levels is selected in the equal loudness unit 27 whereby the threshold $T_d(m)$ represents the selected curve, e.g., in the psychoacoustic frequency (Bark) domain which may be more efficient in terms of memory consumption and which is valid in psychoacoustic terms. In order to increase the resolution of the threshold $T_d(m)$ which is restricted by the number of curves interpolation between two adjacent curves may be applied.

The part of a psychoacoustic modeling unit as shown FIG. 11 may be integrated in an ALC system similar to those shown in FIGS. 6, 8, 9 and 10. An efficient way to achieve this may be to involve the Bark scaled curves of equal loudness levels only at a late stage of the psychoacoustic modeling process. The memory requirements are small since only 24 Bark values need to be stored instead of 513 in case of a 1024 point FFT. The operation can be described as follows:

$$T_{n\_spl}(m), \text{ if } T_{n\_spl}(m) > \text{GainOffset} \cdot T_d(m) \text{ MaskTh}_n(m) = \{\text{GainOffset} \cdot T_d(m), \quad (1)$$

otherwise $$\text{BarkGain}(m) = \text{MaskTh}_n(m) - \text{MaskTh}_m(m) \quad (2)$$

Equation (1) describes how the selected curve of equal loudness $T_d(m)$, which serves independent of the input audio signal x[k] as a reference for the desired loudness, can be combined with the masking threshold(s) of the measured noise signal $T_{n\_spl}(m)$. As can be seen, the maximum of both is detected whereby prior to maximum detection the selected curve of equal loudness $T_d(m)$ is weighted in order to shift the curve into an appropriate operating range. Weighting may be additionally or alternatively performed somewhere else, e.g., in the volume-to-loudness-level conversion unit.

Equation (2) describes how the spectral gains/attenuations $G(\omega)$ are calculated. As can be seen, the spectral gains/attenuations $G(\omega)$ correspond to the difference between the masking threshold of the input audio signal (music signal) $T_m(m)$ and the masking threshold $T_n(m)$ as derived from equation (1) which represents both the background noise and the desired loudness. The Bark gain (attenuation) values BarkGain(m) calculated according to equation (2) can be positive and negative (and vice versa).

The Bark gain (attenuation) values BarkGain(m) may not only control the loudness of the audio signal but also its spectrum (frequency characteristic) based on instant audio signal or its masking threshold MaskTh$_m$(m). Therefore, the ALC systems and methods presented herein may be capable of adjusting both the correct actual loudness and the correct actual psychoacoustic spectrum of the audio signal dependent on both the audio signal and the actual loudness of the current background noise.

The psychoacoustic modeling unit of FIG. 11 may be also applied to the ALC system shown in FIG. 12 where it is referred to as a psychoacoustic gain shaping unit 29. In the system of FIG. 12, the audio signal source 1 supplies the input audio signal x[k], e.g., a music signal from CD player, radio, cassette player or the like, to an ALC system operated in the frequency domain and providing the output audio signal out[k] to the loudspeaker 2. The loudspeaker 2 generates an acoustic signal from the signal out[k]; the acoustic signal is transferred to a microphone 30 via a transfer path 31 that can be described by a transfer function H(z). The signal from the microphone 30 may be supplied via a spectral voice suppression arrangement 32, 33, 34 and the psychoacoustic gain shaping unit 29 (both operated in the frequency domain) to the controllable spectral gain/attenuation unit 11, e.g., a controllable equalizing unit.

The ALC system further includes a Fast-Fourier transform (FFT) unit 35 for transforming signals from the time domain into signals in the frequency domain. The spectral voice suppression arrangement 32, 33, 34 includes a mean calculation unit 32 connected downstream of the Fast-Fourier transform (FFT) unit 35, a subsequent voice activity decoder (VAD) 33 and a subsequent maximum magnitude detector 34 which detects the maximum magnitude of the signal supplied to it by the VAD 33 and the signal received from Fast-Fourier transform (FFT) unit 18. In the mean calculation unit 32 the frequency domain signals from the FFT unit 35 are averaged and supplied to the VAD 33 to suppress spectral voice signal components in the signals from the FFT unit 35. Instead of VAD any other arrangement or method for detecting and suppressing voice components may be used, e.g., minimum statistic algorithms.

The signals from the maximum magnitude detector 34 may be supplied to the psychoacoustic gain shaping unit 29 that receives signals from the Fast-Fourier transform (FFT) unit 15 and transmits signals to the spectral gain/attenuation unit 11. The gain/attenuation unit 11 is connected downstream of the Fast-Fourier transformation (FFT) unit 15 which receives the signal x[k] and transforms it into a spectral signal $X(\omega)$. The signal $X(\omega)$ may be supplied to a frequency domain adaptive filter (FDAF) 36, the psychoacoustic gain shaping unit 29 and to the gain/attenuation unit 11, e.g., a multiplier, which may also receive the spectral gain/attenuation signal representing spectral gain/attenuation factors $G(\omega)$ and generate a spectral signal $OUT(\omega)$ which is fed into the inverse Fast-Fourier transformation (LEFT) unit 17 where it is transformed into the time domain output audio signal out[k].

The adaptive filter 36 operating in the frequency domain receives the time domain microphone signal d[k] representing the total sound level in the environment in question, wherein the total sound level includes both the sound output from the loudspeaker 2 and the ambient noise in this environment (e.g., loudspeaker-room-microphone system). The signal $X(\omega)$ from the Fast-Fourier transform (FFT) unit 35 may be used as a reference signal for the adaptive filter 36. A signal $Y(\omega)$ output by the adaptive filter 36 is supplied to an inverse Fast-Fourier transformation (IFFT) unit 37 and transformed into the signal y[k]. In a subtractor 38 the signal y[k] is subtracted from the signal from the microphone 30 and supplied as a signal s[k]+n[k] to the FFT unit 35.

The volume (Vol) setting is supplied to the psychoacoustic gain shaping unit 29 and to a gain/attenuation unit 19 operating in the time domain which amplifies/attenuates the noise signal from the noise generator 20 and which supplies an amplified/attenuated noise signal n$_s$[k] to the Fast-Fourier transformation (FFT) unit 18. The signal $N_s(\omega)$ provided by the Fast-Fourier transformation (FFT) unit 18 is fed into the maximum magnitude detector 34 which further receives a signal $N\_(\omega)$ from the VAD 33 and which supplies a signal $N\_(\omega)$ to the psychoacoustic gain shaping unit 29. The VAD 33 is supplied with a signal $S\_(\omega)+N\_(\omega)$ from the mean calculation unit 32 which represents the averaged signal $S(\omega)+N(\omega)$ from the Fast-Fourier transformation (FFT) unit 35.

In the ALC system of FIG. 11, the audio signal is input into the loudness/masking model in addition to the measured, estimated or otherwise evaluated background noise. When the noise, which may have any coloring and any level, is input into the loudness/masking model, and the related curve of equal loudness is automatically calculated or selected. Thus, when combining the background noise and the desired loudness (reference) in a very early, it is not required to provide a multiplicity of sets of curves of equal loudness levels.

As can be seen from FIG. 12, the noise generator 20 generates in the time domain an in anyway colored noise signal which is weighted (g) in the gain/attenuation unit 19 according to the volume (Vol) settings and which is subsequently transformed into the frequency domain where its PSD is determined and compared to the PSD of the estimated background noise represented by signal $N\_(\omega)$. The maximum represented by the signal N_(ω) is determined in this comparison and is subsequently fed into the masking model (e.g., the Johnston model).

A modified system of FIG. 12 is shown in FIG. 13. In the system of FIG. 13, amplification/attenuation is shifted from the time domain into the frequency domain. Thus, the controllable gain/attenuation unit 19 operating in the time domain has been omitted and a controllable gain/attenuation unit 21 operating in the frequency domain has been added between Fast-Fourier transform (FFT) unit 18 and maximum magnitude detector 34.

A modified system of FIG. 13 is shown in FIG. 14. In the system of FIG. 14, the background noise synthesizer 20 operating in the time domain and the Fast-Fourier transform (FFT) unit 18 have been omitted and a background noise synthesizer 22 operating in the frequency domain has been added downstream of the controllable gain/attenuation unit 21.

In the exemplary systems described above, calculation or estimation units and methods are employed for evaluation, but any other type of evaluation unit or method is applicable as well. Furthermore, in a simple configuration of the systems described above with reference to FIGS. 9 and 10, the psychoacoustic model applied to the background noise may be established by a table that contains data representing masking thresholds. The data are selected by a signal corresponding to the background noise such as signals representing speed, rpm, etc. Thus, the signals corresponding to the background noise are not transformed into signals representing the background noise and, accordingly, are used to determine directly the masking thresholds.

Figure 15:
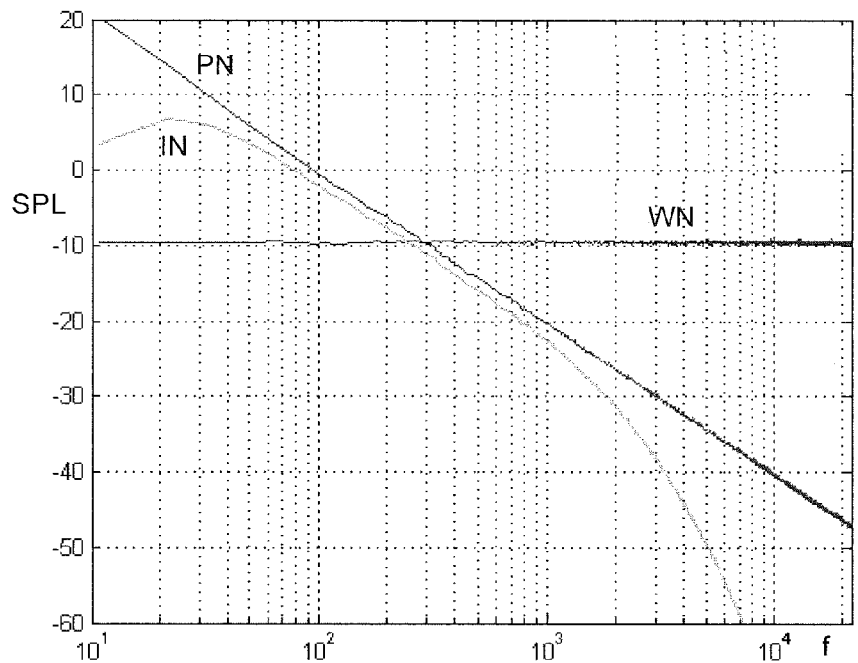
FIG. 15 is a block diagram illustrating the frequency characteristic of different colored noise.

FIG. 15 illustrates the frequency characteristic of different colored noise, in particular white noise WN, pink noise PN and (modified) IEC286 noise IN. If a psychoacoustic scale such as the Bark scale is used, only 24 points for each characteristic need to be stored. For more flexibility the characteristics for a variety of noise characteristics may be stored.

Although various examples have been disclosed, it will be apparent to those skilled in the art that changes and modifications can be made according to a specific implementation of the various embodiments and without departing from the spirit and scope of the invention. It will be obvious to those reasonably skilled in the art that other components performing the same functions may be suitably substituted. Such modifications to the concept are intended to be covered by the appended claims.

What is claimed is:

1. An automatic loudness control system comprising: a controllable gain/attenuation unit that includes a gain/attenuation control input, an audio signal input, an audio signal output, and whose gain/attenuation between the audio signal input and the audio signal output is controlled by the gain/attenuation control input signal;
   a gain/attenuation evaluation unit that is connected to the gain/attenuation control input of the controllable gain/attenuation unit and that has an actual-loudness input and a desired loudness input;
   an actual-loudness evaluation unit that is connected to the audio signal input of the controllable gain/attenuation unit and that provides the actual-loudness input to the gain/attenuation evaluation unit; and
   a desired-loudness evaluation unit that is connected to the desired-loudness input of the gain/attenuation evaluation unit and that has a volume control input;
   in which the gain/attenuation evaluation unit is configured to control the controllable gain/attenuation unit dependent on signals supplied to the volume control input of the desired-loudness evaluation unit and the audio signal input of the controllable gain/attenuation unit,
   wherein the desired-loudness evaluation unit comprises a first conversion unit that converts a volume setting into a signal representing a desired loudness
   in which the actual-loudness evaluation unit further comprises a psychoacoustic modeling unit, and
   in which the psychoacoustic modeling unit employs a psychoacoustic masking model on the input signal.

2. The system of claim 1, in which the psychoacoustic modeling unit employs a psychoacoustic frequency scale.

3. The system of claim 1, in which the psychoacoustic modeling unit receives a signal representing or corresponding to ambient background noise.

4. The system of claim 3, in which the psychoacoustic modeling unit receives a signal representing a desired loudness.

5. The system of claim 4, in which the psychoacoustic modeling unit receives a signal from a maximum magnitude comparator, that provides the higher one of the maximum magnitudes of the ambient background noise and the input audio signal.

6. The system of claim 3, in which the gain/attenuation evaluation unit and the controllable gain/attenuation unit are configured to provide frequency dependent control of the gain/attenuation to provide a frequency dependent gain/attenuation between audio signal input and audio signal output.

7. The system of claim 6, in which the controllable gain/attenuation unit is configured to operate in a frequency domain.

8. The system of claim 1 wherein at least one of a gain/attenuation calculation unit and the actual-loudness evaluation unit is configured to receive and evaluate a signal representing ambient background noise.

9. The system of claim 8, further comprising at least one non-acoustic sensor that picks up a signal corresponding to the ambient background noise and a synthesizer that generates a signal representative of the ambient background noise based on the signal corresponding to the ambient background noise.

10. The system of claim 8, further comprising an acoustic sensor that picks up an acoustic signal that comprises the ambient background noise and the audio signal; and a signal extractor that extracts the ambient background noise from the acoustic signal.

11. The system of claim 10, where at least one of the gain/attenuation evaluation unit and the actual-loudness evaluation unit suppresses spectral voice components in the acoustic signal.

12. The system of one of claim 11, in which at least one of the gain/attenuation evaluation unit and the actual-loudness evaluation unit comprises a mean value evaluation unit.

13. The system of claim 11, in which at least one of the gain/attenuation evaluation unit and the actual-loudness evaluation unit comprises a maximum magnitude detector.

14. The system of claim 1, in which the desired-loudness evaluation unit comprises a second conversion unit that converts a volume setting into a signal representing a desired loudness level.

15. The system of claim 14, in which the desired-loudness evaluation unit comprises a psychoacoustic modeling unit and the psychoacoustic modeling unit comprises an equal-loudness model.

16. The system of claim 14, in which at least one of the gain/attenuation evaluation unit and the actual-loudness evaluation unit comprises a maximum magnitude detector that is controlled by a volume setting, and further comprising a noise generator which provides to the gain/attenuation evaluation unit, a noise signal controlled by the volume setting, wherein at least one of the controllable gain/attenuation unit, a gain/attenuation evaluation unit, the actual-loudness evaluation, the actual-loudness evaluation unit and the noise generator is configured to operate in a frequency domain.

17. An automatic loudness control method comprising: controlling a gain/attenuation applied to an input audio signal and providing an output audio signal that is an amplified/attenuated input audio signal;
evaluating an actual loudness of the input audio signal from the input audio signal and a desired loudness of the input audio signal from a volume control input; and
evaluating the gain/attenuation applied to the input audio signal from the actual loudness and the desired loudness of the input audio signal,
wherein the step of evaluating the desired loudness comprises converting a volume setting into a signal representing a desired loudness,
in which the actual-loudness evaluation employs a psychoacoustic model, and
in which the psychoacoustic model employs a psychoacoustic masking model on the input audio signal.

18. The method of claim 17, in which the psychoacoustic model employs a psychoacoustic frequency scale.

19. The method of claim 17, in which the psychoacoustic model comprises evaluation of a signal representing ambient background noise.

20. The method of claim 19, in which the psychoacoustic model comprises evaluation of a signal representing a desired loudness.

21. The method of claim 17, further comprising receiving a signal that provides the higher one of the maximum magnitude.

22. The method of claim 21, in which the gain/attenuation of the input audio signal is frequency dependent.

23. The method of claim 22, in which the application of gain/attenuation to the input audio signal is performed in a frequency domain.

24. The method of claim 17, wherein the step of evaluating the actual loudness employs the step of evaluating ambient background noise.

25. The method of claim 24, in which sensor signals corresponding to the ambient background noise are picked up by at least one non-acoustic sensor and, based on the signals from the sensor, a signal representative of the ambient background noise is generated.

26. The method of claim 24, in which an acoustic signal that comprises the ambient background noise and the audio signal is picked up by an acoustic sensor; and extracting in the ambient background noise from the acoustic signal using an adaptive filter.

27. An automatic loudness control system comprising:
a controllable gain/attenuation unit that includes a gain/attenuation control input, an audio signal input, an audio signal output, and whose gain/attenuation between the audio signal input and the audio signal output is controlled by the gain/attenuation control input signal;
a gain/attenuation evaluation unit that is connected to the gain/attenuation control input of the controllable gain/attenuation unit and that has an actual-loudness input and a desired-loudness input;
an actual-loudness evaluation unit that is connected to the audio signal input of the controllable gain/attenuation unit and that provides the actual-loudness input to the gain/attenuation evaluation unit; and
a desired-loudness evaluation unit that is connected to the desired-loudness input of the gain/attenuation evaluation unit and that has a volume control input;
in which the gain/attenuation evaluation unit is configured to control the controllable gain/attenuation unit dependent on signals supplied to the volume control input of the desired-loudness evaluation unit and the audio signal input of the controllable gain/attenuation unit,
wherein the desired-loudness evaluation unit comprises a first conversion unit that converts a volume setting into a signal representing a desired loudness,
in which the actual-loudness evaluation unit further comprises a psychoacoustic modeling unit,
in which the psychoacoustic modeling unit receives a signal representing or corresponding to ambient background noise, and
in which the psychoacoustic modeling unit receives from the gain/attenuation evaluation unit, a signal representing a desired loudness.

28. An automatic loudness control system comprising: a controllable gain/attenuation unit that includes a gain/attenuation control input, an audio signal input, an audio signal output, and whose gain/attenuation between the audio signal input and the audio signal output is controlled by the gain/attenuation control input signal;
a gain/attenuation evaluation unit that is connected to the gain/attenuation control input of the controllable gain/attenuation unit and that has an actual-loudness input and a desired-loudness input;
an actual-loudness evaluation unit that is connected to the audio signal input of the controllable gain/attenuation unit and that provides the actual-loudness input to the gain/attenuation evaluation unit; and
a desired-loudness evaluation unit that is connected to the desired-loudness input of the gain/attenuation evaluation unit and that has a volume control input;
in which the gain/attenuation evaluation unit is configured to control the controllable gain/attenuation unit dependent on signals supplied to the volume control input of the desired-loudness evaluation unit and the audio signal input of the controllable gain/attenuation unit,
wherein the desired-loudness evaluation unit comprises a first conversion unit that converts a volume setting into a signal representing a desired loudness,
in which the actual-loudness evaluation unit further comprises a psychoacoustic modeling unit,
in which the psychoacoustic modeling unit receives a signal representing or corresponding to ambient background noise, and
in which the gain/attenuation evaluation unit and the controllable gain/attenuation unit are configured to provide frequency dependent control of the gain/attenuation to provide a frequency dependent gain/attenuation between audio signal input and audio signal output.

29. An automatic loudness control system comprising: a controllable gain/attenuation unit that includes a gain/attenuation control input, an audio signal input, an audio signal output, and whose gain/attenuation between the audio signal input and the audio signal output is controlled by the gain/attenuation control input signal;
a gain/attenuation evaluation unit that is connected to the gain/attenuation control input of the controllable gain/ attenuation unit and that has an actual-loudness input and a desired-loudness input;

an actual-loudness evaluation unit that is connected to the audio signal input of the controllable gain/attenuation unit and that provides the actual-loudness input to the gain/attenuation evaluation unit;

a desired-loudness evaluation unit that is connected to the desired-loudness input of the gain/attenuation evaluation unit and that has a volume control input; and in which the gain/attenuation evaluation unit is configured to control the controllable gain/attenuation unit dependent on signals supplied to the volume control input of the desired-loudness evaluation unit and the audio signal input of the controllable gain/attenuation unit, wherein the desired-loudness evaluation unit comprises a first conversion unit that converts a volume setting into a signal representing a desired loudness, wherein the actual-loudness evaluation unit is configured to receive and evaluate a signal representing ambient background noise, at least one non-acoustic sensor that picks up a signal corresponding to the ambient background noise; and a synthesizer that generates a signal representative of the ambient background noise based on the signal corresponding to the ambient background noise.

30. An automatic loudness control system comprising: a controllable gain/attenuation unit that includes a gain/attenuation control input, an audio signal input, an audio signal output, and whose gain/attenuation between the audio signal input and the audio signal output is controlled by the gain/attenuation control input signal;

a gain/attenuation evaluation unit that is connected to the gain/attenuation control input of the controllable gain/attenuation unit and that has an actual-loudness input and a desired-loudness input;

an actual-loudness evaluation unit that is connected to the audio signal input of the controllable gain/attenuation unit and that provides the actual-loudness input to the gain/attenuation evaluation unit;

a desired-loudness evaluation unit that is connected to the desired-loudness input of the gain/attenuation evaluation unit and that has a volume control input;

in which the gain/attenuation evaluation unit is configured to control the controllable gain/attenuation unit dependent on signals supplied to the volume control input of the desired-loudness evaluation unit and the audio signal input of the controllable gain/attenuation unit, wherein the desired-loudness evaluation unit comprises a first conversion unit that converts a volume setting into a signal representing a desired loudness, and wherein the actual-loudness evaluation unit is configured to receive and evaluate a signal representing ambient background noise, an acoustic sensor that picks up an acoustic signal that comprises the ambient background noise and the audio signal; and a signal extractor that extracts the ambient background noise from the acoustic signal.

31. An automatic loudness control system comprising:
a controllable gain/attenuation unit that includes a gain/attenuation control input, an audio signal input, an audio signal output, and whose gain/attenuation between the audio signal input and the audio signal output is controlled by the gain/attenuation control input signal;

a gain/attenuation evaluation unit that is connected to the gain/attenuation control input of the controllable gain/attenuation unit and that has an actual-loudness input and a desired-loudness input;

an actual-loudness evaluation unit that is connected to the audio signal input of the controllable gain/attenuation unit and that provides the actual-loudness input to the gain/attenuation evaluation unit; and a desired-loudness evaluation unit that is connected to the desired-loudness input of the gain/attenuation evaluation unit and that has a volume control input;

in which the gain/attenuation evaluation unit is configured to control the controllable gain/attenuation unit dependent on signals supplied to the volume control input of the desired-loudness evaluation unit and the audio signal input of the controllable gain/attenuation unit, wherein the desired-loudness evaluation unit comprises a first conversion unit that converts a volume setting into a signal representing a desired loudness, and in which the desired-loudness evaluation unit comprises a second conversion unit that converts a volume setting into a signal representing a desired loudness level.

32. An automatic loudness control method comprising: controlling a gain/attenuation applied to an input audio signal and providing an output audio signal that is an amplified/attenuated input audio signal;

evaluating an actual loudness of the input audio signal from the input audio signal and a desired loudness of the input audio signal from a volume control input; and evaluating the gain/attenuation applied to the input audio signal from the actual loudness and the desired loudness of the input audio signal, wherein the step of evaluating the desired loudness comprises converting a volume setting into a signal representing a desired loudness, in which the actual-loudness evaluation employs a psychoacoustic model, and in which the psychoacoustic model comprises evaluation of a signal representing ambient background noise.

33. An automatic loudness control method comprising:
controlling a gain/attenuation applied to an input audio signal and providing an output audio signal that is an amplified/attenuated input audio signal;

evaluating an actual loudness of the input audio signal from the input audio signal and a desired loudness of the input audio signal from a volume control input; and evaluating the gain/attenuation applied to the input audio signal from the actual loudness and the desired loudness of the input audio signal, and wherein the step of evaluating the desired loudness comprises converting a volume setting into a signal representing a desired loudness, receiving a signal that provides the higher one of the maximum magnitudes of background noise and the input audio signal.

34. An automatic loudness control method comprising:
controlling a gain/attenuation applied to an input audio signal and providing an output audio signal that is an amplified/attenuated input audio signal;

evaluating an actual loudness of the input audio signal from the input audio signal and a desired loudness of the input audio signal from a volume control input; and evaluating the gain/attenuation applied to the input audio signal from the actual loudness and the desired loudness of the input audio signal, and wherein the step of evaluating the desired loudness comprises converting a volume setting into a signal representing a desired loudness, wherein the step of evaluating the actual loudness employs the step of evaluating ambient background noise.

\* \* \* \* \*